United States Patent
Wu et al.

(10) Patent No.: US 6,765,448 B2
(45) Date of Patent: Jul. 20, 2004

(54) SELF-BIASED VCO

(75) Inventors: Yue Wu, San Diego, CA (US);
Vladimir Aparin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/423,261

(22) Filed: Apr. 24, 2003

(65) Prior Publication Data

US 2004/0085144 A1 May 6, 2004

Related U.S. Application Data

(60) Provisional application No. 60/422,658, filed on Oct. 30, 2002.

(51) Int. Cl.[7] .............................. H03B 5/04; H03B 5/08; H03B 5/12
(52) U.S. Cl. ............................ 331/117 FE; 331/117 R; 331/177 R; 331/177 V; 331/186
(58) Field of Search .................................. 331/36 C, 109, 331/117 R, 117 FE, 117 D, 177 R, 177 V, 182–183, 185–186

(56) References Cited

U.S. PATENT DOCUMENTS 6,362,698 B1 * 3/2002 Gupta .................. 331/117 FE

* cited by examiner

Primary Examiner—David Mis
(74) Attorney, Agent, or Firm—Philip R. Wadsworth; Charles D. Brown; Nicholas J. Pauley

(57) ABSTRACT

A self-biased voltage controlled oscillator (VCO) that includes a VCO core including a plurality of switching transistors, a resonant tank circuit operatively coupled to the VCO core, a current source operatively coupled to the VCO core for supplying a bias current to the VCO core, and a biasing circuit operatively coupled to both the resonant tank circuit and to the current source. The biasing circuit and the switching transistors of the VCO core cooperatively function to bias the current source, whereby the VCO is self-biased.

33 Claims, 3 Drawing Sheets

SELF-BIASED VCO

This application claims priority from U.S. Provisional Application Serial No. 60/422,658, filed Oct. 30, 2002, the content of which is incorporated herein by reference in its entirety.

FIELD

The present invention relates to methods for biasing Voltage Controlled Oscillators, and in particular embodiments to biasing Voltage Controlled Oscillators such that the phase noise contributed by the biasing is reduced.

BACKGROUND

Voltage Controlled Oscillators (VCOs) are well-known. VCOs have been used in a wide variety of applications having different requirements. For example, VCOs are presently used in transceivers for wireless communications devices, such as cellular telephones, for generating a Local Oscillator (LO) signal that is mixed in a downconverter with an incoming RF signal to generate an Intermediate Frequency (IF) signal that is then further processed by downstream circuitry within the device. In general, it is desirable that the VCO generate an LO signal that has low phase noise. Phase noise is the noise-to-LO signal power ratio.

Presently available cellular systems utilize a variety of different air interfaces, including GSM (Global System for Mobile Communications), TDMA (Time Division Multiple Access), and CDMA (Code Division Multiple Access). In general, the LO phase noise requirement for CDMA cellular transceivers is much more stringent than the phase noise requirement for TDMA or GSM cellular transceivers. Low phase noise is also desirable for many other VCO applications, including, for example, optic receivers.

VCOs used in cellular transceivers and other applications require separate biasing circuitry, such as a current mirror and a bias current generator, in order to generate the bias current that is required to limit the current of the VCO core. However, such separate biasing circuitry introduces phase noise that is amplified by the current mirror ratio. The use of a low current mirror ratio (e.g., a 1:1 current mirror ratio) may improve phase noise performance, but at the expense of undesirably large power consumption by the biasing circuitry. Moreover, typical biasing circuitry includes some type of positive feedback, which also increases LO phase noise.

Presently available biasing schemes may provide adequate phase noise performance for certain applications, however many applications can benefit from improved phase noise performance.

Based on the above, there presently exists a need in the art for a VCO that is biased in such a manner as to achieve superior phase noise performance in a power-efficient manner. The present invention addresses this and other needs in the art.

SUMMARY

One aspect of the present invention encompasses a self-biased voltage controlled oscillator (VCO) that includes a VCO core including a plurality of switching transistors, a resonant tank circuit operatively coupled to the VCO core, a current source operatively coupled to the VCO core for supplying a bias current to the VCO core, and a biasing circuit operatively coupled to both the resonant tank circuit and to the current source. The biasing circuit and the switching transistors of the VCO core cooperatively function to bias the current source, whereby the VCO is self-biased.

According to another aspect of the present invention, the biasing circuit and the switching transistors of the VCO core, in combination, constitute a constant transconductance biasing circuit that controls the transconductance of the switching transistors of the VCO core.

In a first exemplary embodiment of the present invention, the current source is a PMOS transistor, the resonant tank circuit is an LC resonant tank circuit includes a pair of varactor diodes, and an inductor, arranged in parallel. A DC bias voltage is supplied to the central tap of the inductor. The switching transistors of the VCO core illustratively may include a first pair of cross-coupled PMOS transistors and a second pair of cross-coupled NMOS transistors. The LC resonant tank circuit illustratively may be arranged in parallel between the first and second pairs of cross-coupled CMOS transistors of the VCO core.

In the first exemplary embodiment, the biasing circuit includes an uppermost CMOS transistor having a first electrode coupled to the power supply voltage, a gate electrode coupled to the gate electrode of the current source, and a second electrode coupled to the gate electrodes of the uppermost CMOS transistor and the current source; an intermediate CMOS transistor having a first electrode coupled to the second electrode of the uppermost CMOS transistor, a gate electrode coupled to the second electrode of the current source, and a second electrode; a lowermost CMOS transistor having a first electrode coupled to the second electrode of the intermediate CMOS transistor, a second electrode coupled to ground, and a gate electrode coupled to a biasing point of the VCO core; and, a resistor connected between the second electrode of the lowermost CMOS transistor and ground.

In the first exemplary embodiment, the first pair of switching transistors of the VCO core includes a first PMOS transistor having a gate electrode, a first electrode coupled to a first node, and a second electrode coupled to a first terminal of the inductor, and a second PMOS transistor having a gate electrode coupled to the second electrode of the first PMOS transistor, a first electrode coupled to the first node, and a second electrode coupled to both a second terminal of the inductor and to the gate electrode of the first PMOS transistor. The second pair of switching transistors of the VCO core includes a first NMOS transistor having a gate electrode, a first electrode coupled to a second node, and a second electrode coupled to the first terminal of the inductor, and a second NMOS transistor having a gate electrode coupled to the second electrode of the first NMOS transistor, a first electrode coupled to the second node, and a second electrode coupled to both the second terminal of the inductor and to the gate electrode of the first NMOS transistor.

The first exemplary embodiment also includes a first inductor coupled between the second electrode of the current source and the first node, and a second inductor coupled between ground and the second node.

In a second exemplary embodiment of the present invention, the VCO further includes a first capacitor coupled between the second plate of the first varactor and the second electrode of the first NMOS transistor of the second pair of switching transistors of the VCO core; and, a second capacitor connected between the second plate of the second varactor and the second electrode of the second NMOS transistor of the second pair of switching transistors of the VCO core. The second exemplary embodiment further includes a first biasing resistor coupled between a first tank circuit node and a VCO frequency tuning voltage; and, a second biasing resistor coupled between a second tank circuit node and the VCO frequency tuning voltage. The first tank circuit node is between the first capacitor and the first varactor of the tank circuit, and the second tank circuit node is between the second capacitor and the second varactor of the tank circuit.

Other objects, features, and advantages of the present invention will become apparent from the following detailed description taken in conjunction with the accompanying drawings, illustrating by way of example teachings of the present invention.

DETAILED DESCRIPTION

Figure 1:
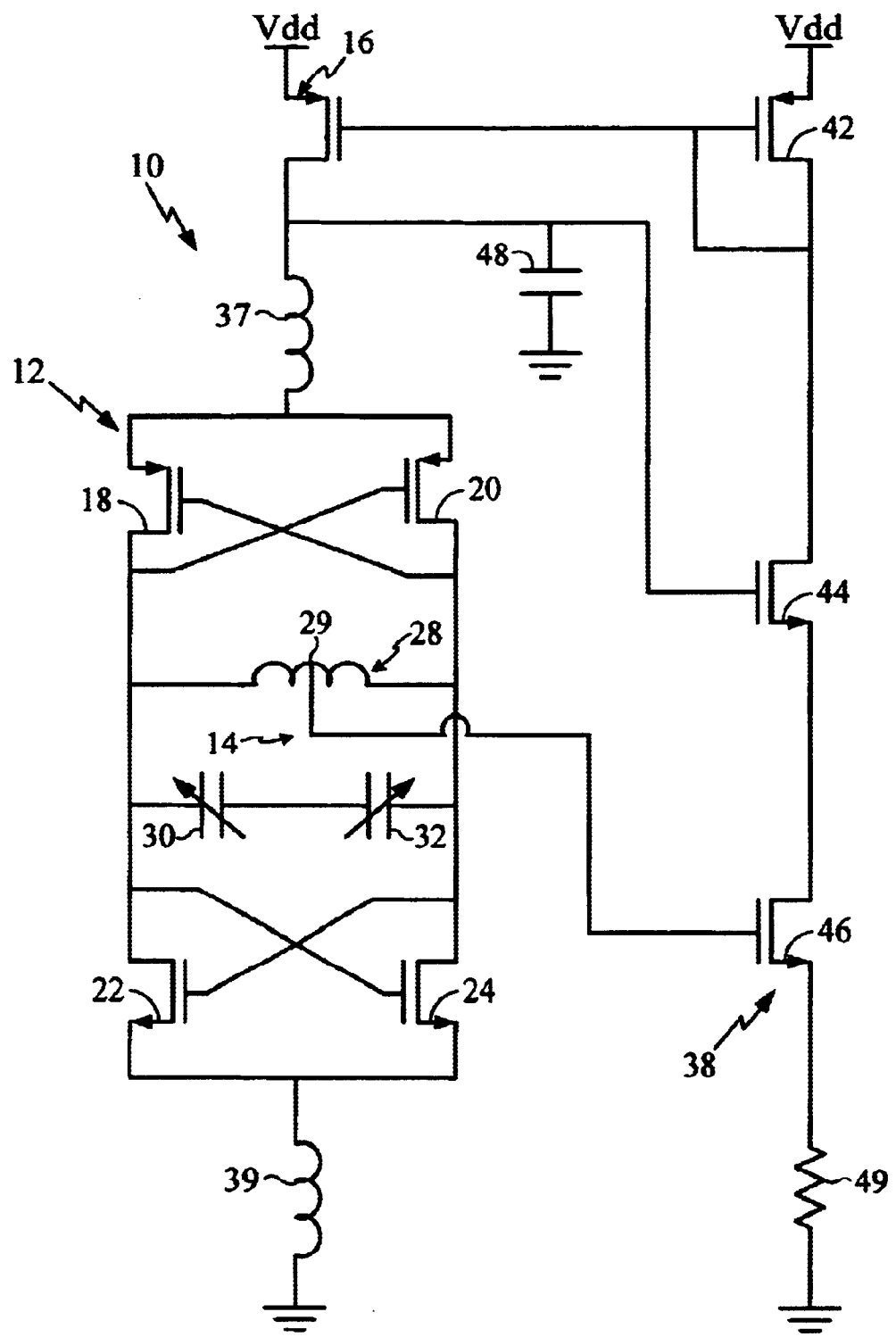
FIG. 1 is a schematic diagram of a VCO constructed in accordance with a first exemplary embodiment of the present invention.

With reference to FIG. 1, there can be seen a schematic diagram of a VCO 10 constructed in accordance with a first exemplary embodiment of the present invention. The VCO 10 includes a VCO core 12, a resonant tank circuit 14, a current source 16, and a biasing circuit 38 interconnected in a manner described below.

The VCO core 12 includes CMOS switching transistors 18, 20, 22, and 24. The CMOS switching transistors 18 and 20 are illustratively cross-coupled PMOS transistors, with the gate electrode of the PMOS transistor 18 being coupled to the drain electrode of the PMOS transistor 20, and the gate electrode of the PMOS transistor 20 being coupled to the drain electrode of the PMOS transistor 18. The CMOS switching transistors 22 and 24 are illustratively cross-coupled NMOS transistors, with the gate electrode of the NMOS transistor 22 being coupled to the drain electrode of the NMOS transistor 24 and the gate electrode of the NMOS transistor 24 being coupled to the drain electrode of the NMOS transistor 22.

The resonant tank circuit 14 is illustratively a parallel LC resonant tank circuit that includes an inductor 28, such as an on-chip spiral inductor, arranged in parallel with a pair of spaced-apart varactors 30, 32, such as on-chip MOS varactors, between the pair of cross-coupled PMOS transistors 18, 20, and the pair of cross-coupled NMOS transistors 22, 24. The inductor 28 has a center tap 29 that exhibits negligible resistance (e.g., several hundred mΩ) at DC frequency. For most practical applications, this negligible resistance can be ignored, thereby allowing a DC voltage to be obtained from the center tap 29 for purpose of DC biasing, as will become more fully apparent hereinafter.

The current source 16 (sometimes referred to as a "tail current source"), is illustratively a PMOS transistor connected between a power supply voltage Vdd and a first terminal of an inductor 37. The current source 16 functions to limit the current through the switching transistors 18, 20, 22, and 24 of the VCO core 12, and to increase the resistance at the biasing point of the VCO core 12. The inductor 37 functions to increase impedance at the common source of the PMOS transistors 18, 20, for the purpose of power supply noise rejection. An inductor of this type is sometimes referred to in the art as a "source degeneration inductor." An additional source degeneration inductor 39 is provided between the common source of the NMOS transistors 22, 24, and ground, for the same purpose.

The biasing circuit 38 includes a PMOS transistor 42, an NMOS transistor 44, an NMOS transistor 46, and a resistor 49 connected in series. The source electrode of the PMOS transistor 42 is connected to the power supply voltage Vdd, and the gate electrode of the PMOS transistor 42 is coupled to the gate electrode of the PMOS transistor 16 that serves as the current source for the VCO core 12. The gate electrodes of both the PMOS transistor 16 and the PMOS transistor 42 are coupled in common to the drain electrode of the PMOS transistor 42. The gate electrode of the NMOS transistor 44 is coupled to a node between a first terminal of the source degeneration inductor 37 and the drain electrode of the PMOS transistor 16. A capacitor 48 is connected between the gate electrode of the PMOS transistor 42 and ground for the purpose of filtering high-frequency noise generated by the current source 16 to ground. The drain electrode of the NMOS transistor 44 is connected to the drain electrode of the PMOS transistor 42. The gate electrode of the NMOS transistor 46 is coupled to the center tap 29 of the inductor 28 of the resonant tank circuit 14, the drain electrode of the NMOS transistor 46 is connected to the source electrode of the NMOS transistor 44, and the source electrode of the NMOS transistor 45 is coupled to a first terminal of the resistor 49. The second terminal of the resistor 49 is connected to ground.

Figure 2:
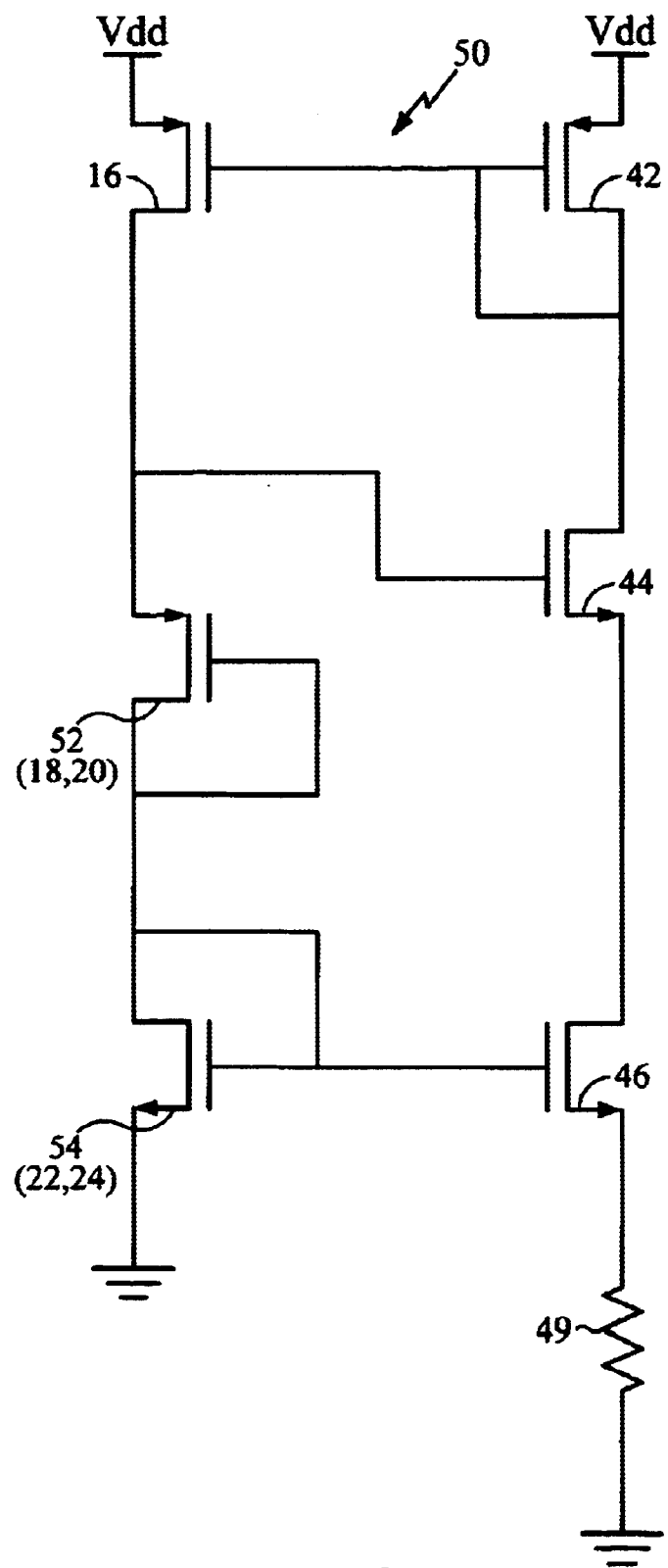
FIG. 2 is an equivalent circuit diagram of the circuit depicted in FIG. 1.

With additional reference now to FIG. 2, there can be seen an equivalent circuit diagram of the VCO biasing circuitry 50, which includes the VCO core 12 and the biasing circuit 38. As will be appreciated by those having ordinary skill in the pertinent art, the switching transistors 18, 20, 22, and 24 of the VCO core 12 may also serve as part of the VCO biasing circuitry 50, along with the biasing circuit 38, in a manner described below. More particularly, as is shown in FIG. 2, the pair of PMOS transistors 18, 20 of the VCO core 12 together form a diode-connected PMOS transistor 52, and the pair of NMOS transistors 22, 24 of the VCO core 12 together form a diode-connected NMOS transistor 54, with the diode-connected PMOS transistor 52 and the diode-connected NMOS transistor 54 connected in cascode between the drain electrode of the PMOS transistor 14 (current source) and ground. Thus, the VCO core 12 is formed by a cascode arrangement of the two diode-connected transistors 52, 54.

With continuing reference to FIG. 2, the source electrode of the diode-connected PMOS transistor 52 is coupled to the gate electrode of the NMOS transistor 44 of the biasing circuit 38. The gate and drain electrodes of the diode-connected NMOS transistor 44 of the VCO core 12 are coupled to the NMOS transistor 46 of the biasing circuit 38. The PMOS transistor 42 of the biasing circuit 42 is diode-connected, with the gate electrodes of the PMOS transistor 14 (current source) and the PMOS transistor 42 are commonly coupled to the drain electrode of the PMOS transistor 42.

With continuing reference to FIG. 2, the diode-connected transistors 52, 54 of the VCO core 12, the PMOS transistor 14 (current source), the diode-connected PMOS transistor 42 of the biasing circuit 38, the NMOS transistors 44, 46 of the biasing circuit 38, and the resistor 49 of the biasing circuit 38, collectively constitute a cascode current mirror, which functions as a constant transconductance ($g_m$) biasing circuit 50 for the VCO 10. NMOS transistor 44 functions to increase output impedance for the lower part of the constant transconductance ($g_m$) biasing circuit 50.

Assuming that the current mirror ratio of the top part of the constant transconductance ($g_m$) biasing circuit 50 is N, assuming that N is sufficiently large and/or the size of the NMOS transistor 46 of the biasing circuit 38 is much larger than the diode-connected NMOS transistor 54 of the VCO core 12, and assuming that the threshold voltages of the transistors 46 and 54 are the same, then $g_m=2N/R$, where $g_m$ is the transconductance of the switching transistors 18, 20, 22, and 24 of the VCO core 12, and R is the resistance value of the resistor 49 of the biasing circuit 38.

It will be appreciated by those having ordinary skill in the pertinent art that the absolute value of $g_m$ is not critical, so long as it is large enough to initiate oscillation of the VCO 10. In this regard, the value of $g_m$ may be sufficient to compensate for the loss of the resonant tank circuit 14. Further, it will be appreciated by those having ordinary skill in the pertinent art that the constant transconductance ($g_m$) biasing circuit 50 facilitates controllable adjustment of $g_m$ by adjusting the value of the resistance value R of the resistor 49.

The self-biased VCO of the present embodiments provides several significant advantages over presently available VCOs that are biased using external bias circuitry, such as an external current mirror. In particular, with the self-biased VCO of the present embodiments, no additional, external circuitry is required to generate a DC bias voltage at the gate of the NMOS transistor 46; rather, the DC bias voltage is obtained from the center tap 29 of the inductor 28 of the resonant tank circuit 14. Further, since the switching transistors 18, 20, 22, and 24 of the VCO core 12 also serve as part of the VCO biasing circuitry 50 (i.e., they are "re-used" for this purpose), the phase noise of the VCO is greatly reduced relative to presently available VCOs that are not self-biased in this manner. In this connection, the phase noise gain of the self-biased VCO of embodiments of the present invention may be 10 dB or lower when compared to conventional externally-biased VCOs. Simulation results have shown that the phase noise contribution of the VCO biasing circuitry 50 may be less than 1 per cent, whereas the external biasing circuitry of conventional, externally-biased VCOs may be the dominant noise contributor. Furthermore, the power consumption of the self-biased VCO of the present embodiments is relatively small.

Figure 3:
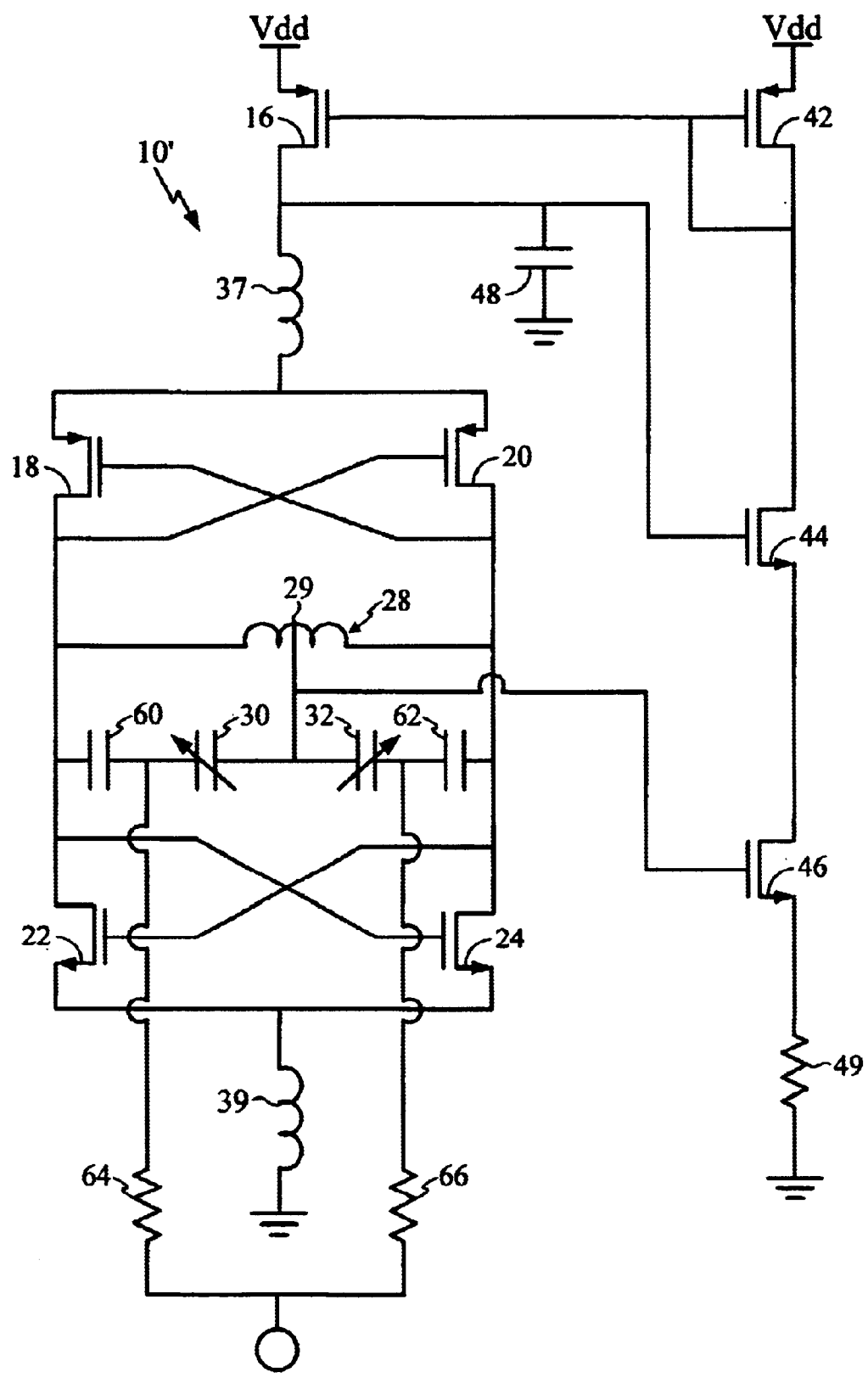
FIG. 3 is a schematic diagram of a VCO constructed in accordance with a second exemplary embodiment of the present invention.

With reference now to FIG. 3, there can be seen a schematic diagram of a VCO 10' constructed in accordance with a second exemplary embodiment of the present invention. As can be readily seen by comparing FIGS. 1 and 3, the VCO 10' of the second exemplary embodiment has the same circuit elements as does the VCO 10 of the first exemplary embodiment, except for the addition of capacitors 60, 62, and resistors 64, 66. Since the common elements of both exemplary embodiments have already been fully described hereinabove in connection with the description of the first exemplary embodiment depicted in FIG. 1, that description of those common circuit elements will not be repeated here.

As can be seen in FIG. 3, the capacitor 60 of the VCO 10' is coupled between an outer plate of the varactor 30 and a node between the drain electrodes of the PMOS transistor 18 and the NMOS transistor 22. The capacitor 60 of the VCO 10' is connected between an outer plate of the varactor 32 and a node between the drain electrodes of the PMOS transistor 20 and the NMOS transistor 24. Because the varactors 30, 32 are DC-isolated by the capacitors 60, 62, the node between the varactors 30, 32 is coupled to the center tap 29 of the inductor 28 of the resonant tank circuit 14, whereby the DC bias voltage for the varactors 30, 32 is obtained from the center tap 29 of the inductor 28. The node between the varactor 30 and the capacitor 60 is connected to one terminal of the resistor 64, whose opposite terminal is coupled to a frequency tuning voltage V_tune. Similarly, the node between the varactor 32 and the capacitor 62 is connected to one terminal of the resistor 66, whose opposite terminal is coupled to the frequency tuning voltage V_tune.

Although the principles and various embodiments of the present invention have been described in detail hereinabove, it should be appreciated that many variations, extensions, modifications, and alternative embodiments of the present invention that will become apparent to those having ordinary skill in the art will still fall within the spirit and scope of the present invention, as defined in the appended claims.

What is claimed is:

1. A self-biased voltage controlled oscillator (VCO), comprising:
    a VCO core including a plurality of switching transistors;
    a resonant tank circuit operatively coupled to the VCO core;
    a current source operatively coupled to the VCO core for supplying a bias current to the VCO core; and,
    a biasing circuit operatively coupled to both the resonant tank circuit and to the current source,
    wherein the biasing circuit and the switching transistors of the VCO core cooperatively function to bias the current source, whereby the VCO is self-biased.

2. The self-biased VCO as set forth in claim 1, wherein the current source comprises a tail current source having a first electrode coupled to a power supply voltage, a second electrode, and a gate electrode.

3. The self-biased VCO as set forth in claim 1, wherein the current source comprises a PMOS transistor.

4. The self-biased VCO as set forth in claim 1, wherein the resonant tank circuit comprises an LC resonant tank circuit.

5. The self-biased VCO as set forth in claim 4, wherein the LC resonant tank circuit includes at least one varactor and an inductor arranged in parallel.

6. The self-biased VCO as set forth in claim 5, wherein the inductor has a central tap that exhibits negligible resistance at DC frequency.

7. The self-biased VCO as set forth in claim 6, wherein the central tap of the inductor is connected to the biasing circuit to supply a DC bias voltage thereto.

8. The self-biased VCO as set forth in claim 1, wherein the switching transistors of the VCO core comprise CMOS transistors.

9. The self-biased VCO as set forth in claim 1, wherein the switching transistors of the VCO core comprise:
    a first pair of cross-coupled CMOS transistors; and,
    a second pair of cross-coupled CMOS transistors,
    wherein the first pair is coupled between the current source and the resonant tank circuit, and the second pair is coupled between the resonant tank circuit and ground.

10. The self-biased VCO as set forth in claim 9, wherein the first pair comprises PMOS transistors, and the second pair comprises NMOS transistors.

11. The self-biased VCO as set forth in claim 9, wherein the resonant tank circuit comprises an LC resonant tank circuit that includes at least one varactor and an inductor arranged in parallel between the first pair and second pair of cross-coupled CMOS transistors.

12. The self-biased VCO as set forth in claim 1, wherein the biasing circuit includes a plurality of CMOS transistors connected in series between a power supply voltage and ground.

13. The self-biased VCO as set forth in claim 12, further comprising a resistor connected between a lowermost one of the plurality of CMOS transistors of the current mirror, and ground.

14. The self-biased VCO as set forth in claim 12, wherein the current source comprises a CMOS transistor having a first electrode coupled to the power supply voltage, a gate electrode, and a second electrode.

15. The self-biased VCO as set forth in claim 14, wherein the plurality of CMOS transistors of the biasing circuit comprise:
   an uppermost CMOS transistor having a first electrode coupled to the power supply voltage, a gate electrode coupled to the gate electrode of the current source, and a second electrode coupled to the gate electrodes of the uppermost CMOS transistor and the current source;
   an intermediate CMOS transistor having a first electrode coupled to the second electrode of the uppermost CMOS transistor, a gate electrode coupled to the second electrode of the current source, and a second electrode; and,
   a lowermost CMOS transistor having a first electrode coupled to the second electrode of the intermediate CMOS transistor, a second electrode coupled to ground, and a gate electrode coupled to a biasing point of the VCO core.

16. The self-biased VCO as set forth in claim 15, further comprising a resistor connected between the second electrode of the lowermost CMOS transistor and ground.

17. The self-biased VCO as set forth in claim 16, wherein the intermediate and lowermost CMOS transistors comprise NMOS transistors, and the uppermost CMOS transistor comprises a PMOS transistor.

18. The self-biased VCO as set forth in claim 17, wherein the current source comprises a PMOS transistor.

19. The self-biased VCO as set forth in claim 16, wherein the switching transistors of the VCO core comprise:
   a first pair of cross-coupled CMOS transistors; and,
   a second pair of cross-coupled CMOS transistors,
   wherein the first pair is coupled between the current source and the resonant tank circuit, and the second pair is coupled between the resonant tank circuit and ground.

20. The self-biased VCO as set forth in claim 19, wherein the resonant tank circuit comprises an LC resonant tank circuit that includes at least one varactor and an inductor arranged in parallel between the first pair and second pair of cross-coupled CMOS transistors.

21. The self-biased VCO as set forth in claim 20, wherein:
   the inductor has a central tap that exhibits negligible resistance at DC frequency; and,
   the central tap of the inductor is connected to the gate electrode of the lowermost CMOS transistor of the biasing circuit to supply a DC bias voltage thereto.

22. The self-biased VCO as set forth in claim 21, further comprising:
   a first inductor coupled between the second electrode of the current source and a first node common to a first electrode of each of the CMOS transistors of the first pair of switching transistors; and,
   a second inductor coupled between ground and a second node common to a first electrode of each of the CMOS transistors of the second pair of switching transistors.

23. The self-biased VCO as set forth in claim 21, further comprising a capacitor having a first plate coupled to the gate electrode of the intermediate CMOS transistor of the biasing circuit and to the second electrode of the current source, and a second plate coupled to ground.

24. The self-biased VCO as set forth in claim 22, further comprising a capacitor having a first plate coupled to the gate electrode of the intermediate CMOS transistor of the biasing circuit and to the second electrode of the current source, and a second plate coupled to ground.

25. The self-biased VCO as set forth in claim 21, wherein:
   the first pair of switching transistors of the VCO core comprises:
      a first PMOS transistor having a gate electrode, a first electrode coupled to a first node, and a second electrode coupled to a first terminal of the inductor; and,
      a second PMOS transistor having a gate electrode coupled to the second electrode of the first PMOS transistor, a first electrode coupled to the first node, and a second electrode coupled to both a second terminal of the inductor and to the gate electrode of the first PMOS transistor; and,
   the second pair of switching transistors of the VCO core comprises:
      a first NMOS transistor having a gate electrode, a first electrode coupled to a second node, and a second electrode coupled to the first terminal of the inductor; and,
      a second NMOS transistor having a gate electrode coupled to the second electrode of the first NMOS transistor, a first electrode coupled to the second node, and a second electrode coupled to both the second terminal of the inductor and to the gate electrode of the first NMOS transistor.

26. The self-biased VCO as set forth in claim 25, further comprising:
   a first inductor coupled between the second electrode of the current source and the first node; and,
   a second inductor coupled between ground and the second node.

27. The self-biased VCO as set forth in claim 26, wherein the at least one varactor comprises:
   a first varactor having a first plate and a second plate; and,
   a second varactor having a first plate and a second plate,
   wherein a node between the first plate of the first varactor and first plate of the second varactor is coupled to the central tap of the inductor of the resonant tank circuit.

28. The self-biased VCO as set forth in claim 27, further comprising:
   a first capacitor connected between the second plate of the first varactor and the second electrode of the first NMOS transistor of the second pair of switching transistors of the VCO core; and,
   a second capacitor connected between the second plate of the second varactor and the second electrode of the second NMOS transistor of the second pair of switching transistors of the VCO core.

29. The self-biased VCO as set forth in claim 28, further comprising:
   a first biasing resistor coupled between a first tank circuit node and a VCO frequency tuning voltage; and,
   a second biasing resistor coupled between a second tank circuit node and the VCO frequency tuning voltage, wherein the first tank circuit node is between the first capacitor and the first varactor of the tank circuit, and the second tank circuit node is between the second capacitor and the second varactor of the tank circuit.

30. The self-biased VCO as set forth in claim 1, wherein the biasing circuit and the switching transistors of the VCO core, in combination, comprise a constant transconductance biasing circuit that controls the transconductance of the switching transistors of the VCO core.

31. The self-biased VCO as set forth in claim 21, wherein the biasing circuit and the switching transistors of the VCO core, in combination, comprise a constant transconductance biasing circuit that controls the transconductance of the switching transistors of the VCO core.

32. The self-biased VCO as set forth in claim 25, wherein the biasing circuit and the switching transistors of the VCO core, in combination, comprise a constant transconductance biasing circuit that controls the transconductance of the switching transistors of the VCO core.

33. The self-biased VCO as set forth in claim 29, wherein the biasing circuit and the switching transistors of the VCO core, in combination, comprise a constant transconductance biasing circuit that controls the transconductance of the switching transistors of the VCO core.

* * * * *

UNITED STATES PATENT AND TRADEMARK OFFICE
CERTIFICATE OF CORRECTION

PATENT NO. : 6,765,448 B2  
DATED : July 20, 2004  
INVENTOR(S) : Yue Wu and Vladimir Aparin It is certified that error appears in the above-identified patent and that said Letters Patent is hereby corrected as shown below:

Column 4,  
Line 28, change "45" to -- 46 --.  
Line 45, change "14" to -- 52 --.  
Line 53, change "44" to -- 54 --.  
Line 55, change "42" to -- 38 -- (second occurrence).  
Line 57, change "14" to -- 16 --.  
Line 62, change "14" to -- 16 --.

Column 5,  
Line 62, change "60" to -- 62 --.

Signed and Sealed this

Twenty-fifth Day of April, 2006

JON W. DUDAS  
*Director of the United States Patent and Trademark Office*